United States Patent
Motobe et al.

(10) Patent No.: US 7,566,501 B2
(45) Date of Patent: Jul. 28, 2009

(54) RESIN COMPOSITION FOR PRINTED WIRING BOARD, PREPREG, LAMINATE, AND PRINTED WIRING BOARD MADE WITH THE SAME

(75) Inventors: Hidetsugu Motobe, Koriyama (JP); Akinori Hibino, Koriyama (JP); Katsuhiko Ito, Fukushima (JP)

(73) Assignee: Matsushita Electric Works, Ltd., Osaka (JP)

( * ) Notice: Subject to any disclaimer, the term of this patent is extended or adjusted under 35 U.S.C. 154(b) by 444 days.

(21) Appl. No.: 10/565,407

(22) PCT Filed: Mar. 31, 2004

(86) PCT No.: PCT/JP2004/004723

§ 371 (c)(1),
(2), (4) Date: Jan. 20, 2006

(87) PCT Pub. No.: WO2005/007724

PCT Pub. Date: Jan. 27, 2005

(65) Prior Publication Data

US 2006/0216495 A1    Sep. 28, 2006

(30) Foreign Application Priority Data

Jul. 22, 2003 (WO) .................. PCT/JP03/009258

(51) Int. Cl.
B32B 15/092 (2006.01)
B32B 27/04 (2006.01)
B32B 27/20 (2006.01)
B32B 27/38 (2006.01)
C09J 163/00 (2006.01)
C08L 63/00 (2006.01)

(52) U.S. Cl. .................. 428/418; 428/297.4; 428/416; 156/330; 523/443; 523/466

(58) Field of Classification Search .............. None
See application file for complete search history.

(56) References Cited

U.S. PATENT DOCUMENTS

2003/0153650 A1 *  8/2003  Tada et al. ............... 523/400

FOREIGN PATENT DOCUMENTS

| JP | 9136943 | 5/1997 |
|---|---|---|
| JP | 11269355 | 10/1999 |
| JP | 2001102758 | 4/2001 |
| JP | 2003020327 | 1/2003 |
| JP | 2003128877 | 5/2003 |
| JP | 2004149577 | 5/2004 |
| WO | WO 01/51562 A1 * | 7/2001 |

OTHER PUBLICATIONS

Machine translation of JP 2001-102758, provided by the JPO website (2001).*
Revised Publication with International Search Report for WO2005007724, Jun. 23, 2005 (5 pages).
English Translation of International Preliminary Report on Patentability for WO2005007724, Issued May 15, 2006 (5 pages).
English Translation of the Written Opinion of the International Search Authority for WO2005007724, May 15, 2006 (4 pages).

* cited by examiner

*Primary Examiner*—Michael J Feely
(74) *Attorney, Agent, or Firm*—Meyertons, Hood, Kivlin, Kowert & Goetzel, P.C.; Eric B. Meyertons

(57) ABSTRACT

An epoxy resin composition for printed wiring boards which comprises an epoxy resin, a phenolic novolak, a curing accelerator, and a silica filler, characterized in that the silica filler has a shape having at least two planes and has an average particle diameter of 0.3 to 10 μm and a specific surface area of 8 to 30 $m^2/g$. The epoxy resin composition has a higher apparent viscosity than the resins and can hence be inhibited from sagging in a drying oven. This composition retains the intact property of infiltration into reinforcements because the viscosity of the resins themselves has not increased locally. The composition hence produces the effect of improving the appearance of a prepreg.

11 Claims, No Drawings

RESIN COMPOSITION FOR PRINTED WIRING BOARD, PREPREG, LAMINATE, AND PRINTED WIRING BOARD MADE WITH THE SAME

FIELD OF INVENTION

The present invention relates to an epoxy resin composition for a printed wiring board used in manufacturing of an electric laminated board, a prepreg for a printed wiring board, as well as a laminated board for a printed wiring board, a printed wiring board and a laminated printed wiring board, using this prepreg, for use in an electronic device.

BACKGROUND OF THE INVENTION

Dicyandiamide (DICY) has been used for a long period of time as a curing agent of epoxy resins for printed wiring boards. However, a material superior in a long term insulation reliability (CAF resistance) and a material with a high decomposition temperature required for lead-free soldering have been demanded as a requirement along with higher density wiring in printed wiring boards in recent years, so that phenol type curing systems superior in these properties have been used as the curing agent.

However, phenol type curing agents have problems such that they cannot impregnate well into a glass base substrate and prepregs prepared therefrom are poor in appearance.

In regards to improvement of appearance in prepregs, it is described in Japan Patent Kokai H07-48586 and Japan Patent Kokai H07-68380 that impregnation into the prepreg is improved by reacting tetrabromobisphenol A with both a bisphenol A type epoxy resin and a novolac type epoxy resin in preparation of prepregs; and it is described in Japan Patent 3395845 that appearance of prepregs is improved by using a bisphenol novolac resin with a softening temperature of 60° C. to 90° C.

DISCLOSURE OF THE INVENTION

The present inventors have reached the present invention, finding that, through using a specific silica filler in phenol-curing resin prepregs for laminated boards, are effectively improved appearance of prepregs has been attained.

It is well known heretofore that fillers (filling materials) are used for reducing coefficient of thermal expansion (decreasing α), increasing rigidity or reducing water adsorptivity in laminated boards. Specifically, as described in Japan Patent Kokai H06-216484, low water adsorptivity has been achieved by using a spherical inorganic filler with a small specific surface area (0.2 m$^2$/g to 2.0 m$^2$/g).

However, the present inventors have found that addition of a silica filler, having a particular shape, a prescribed range of average particle diameter and a prescribed range of specific surface area, to an epoxy resin system using a phenolic curing agent, is capable of improving appearance of prepregs, through increasing apparent resin viscosity to prevent resin sagging within a drying oven, as well as not impairing penetrativity into a reinforcing material, since viscosity of the resin itself does not increase locally, and is capable of improving appearance of prepregs.

The present invention has been achieved in view of the above problems. It is an object of the present invention to provide a prepreg having good appearance, in system using a phenolic curing agent, which is superior in heat resistance, as well as to provide a metal foil-clad laminated board using the above prepreg and to provide a printed wiring board using this metal foil-clad laminated board.

SUMMARY OF THE INVENTION

In order to achieve the purpose mentioned above, is provided according to the present invention, an epoxy resin composition for a printed wiring board, comprising an epoxy resin, a phenol novolac resin, a curing accelerator and a silica filler, characterized in that, as the silica filler, is used a silica filler which has a shape having at least two planes, and has an average particle diameter between 0.3 μm and 10 μm and a relative surface area between 8 m$^2$/g and 30 m$^2$/g.

In the epoxy resin composition for a printed wiring board according to this invention, it is preferred to use a silica filler having at least two planes in the shape, an average particle diameter between 0.3 μm and 10 μm and a relative surface area between 10 m$^2$/g and 20 m$^2$/g.

In the epoxy resin composition for a printed wiring board of the invention, said silica filler is preferably added in an amount of from 3% to 80% by weight per the solid content of the resin.

In the epoxy resin composition for a printed wiring board of the invention, said silica filler is used preferably having an electric conductivity of 15 μs or less.

In the epoxy resin composition for a printed wiring board of the invention, as said silica filler, is used preferably a silica filler which has been vitrified through melting at a temperature of 1800° C. or higher.

In another aspect of the epoxy resin composition for a printed wiring board of the present invention, is used an epoxy resin which has a bromine content of between 5% and 20% by weight per the solid content of the resin without silica filler, and contains an epoxy resin obtainable by reacting a dihydric phenol with a bisphenol A type epoxy resin in an amount of between 40% and 100% by weight based on the whole amount of the epoxy resin solid content.

In still another aspect of the epoxy resin composition for a printed wiring board of this invention, is used an epoxy resin having a bromine content of between 5% and 20% by weight per the solid content of the resin without silica filler and containing an epoxy resin possessing a dicyclopentadienyl structure in an amount of between 40% and 100% by weight based on the whole amount of the epoxy resin solid content.

In yet another aspect of the epoxy resin composition for a printed wiring board of the invention, is used an epoxy resin having a bromine content of between 5% and 20% by weight per the solid content of the resin without silica filler and containing of a novolac type epoxy resin in an amount of between 40% and 100% by weight based on the whole amount of the epoxy resin solid content.

In further aspect of the invention, the epoxy resin composition for a printed wiring board does not contain any bromine.

A prepreg according to the present invention is manufactured by impregnating a reinforcing material with the epoxy resin composition for a printed wiring board as described above, followed by drying and semi-curing the composition to B-stage.

A laminated board according to this invention is prepared by gluing the prepreg as above to a metal foil surface and hot pressing them.

A printed wiring board according to the invention is prepared by using the metal foil clad laminated board mentioned above.

DISCLOSURE OF THE INVENTION IN DETAIL

Embodiments according to the present invention are described below.

It is essential in this invention that the epoxy resin composition for a printed wiring board used therein is comprised of an epoxy resin, a phenol novolac resin, a curing accelerator and a silica filler. The composition may comprise an organic solvent and others, such as a UV screener and a fluorescent agent as needed.

Epoxy resins are not particularly limited, but include, for example, bifunctional epoxy resins, such as bisphenol A type epoxy resins, bisphenol F type epoxy resins and tetrabromobisphenol A type epoxy resins, or brominated derivatives of these; novolac type epoxy resins, such as cresol novolac type epoxy resins or brominated derivatives thereof; dicyclpentadienyl type epoxy resins; biphenyl type epoxy resins, such as tetramethylbiphenyl epoxy resins; polyfunctional epoxy resins, such as trifunctional epoxy resins and tetrafunctional epoxy resins; and hydroquinone type epoxy resins or brominated derivatives thereof. These resins can be used singly or in combination of two or more as a mixture.

Among brominated epoxy resins as mentioned above, preferred, in view of achieving well balanced fire retardancy of the cured product with cost, are ones having a bromine content of between 5% and 20% by weight per the solid content of the whole resin (without silica filler), and containing an epoxy resin obtainable by reacting a dihydric phenol with a bisphenol A type epoxy resin in an amount of at least 40% and up to 100% by weight based on the whole amount of the epoxy resin solid content.

Besides, among brominated epoxy resins as above, preferred, for the purpose of attaining lower hygroscopicity with retaining good fire retardancy of the cured product, are ones having a bromine content of between 5% and 20% by weight per the solid content of the whole resin (without silica filler), and containing an epoxy resin having a dicylopentadienyl structure in an amount of at least 40% and up to 100% by weight based on the whole amount of the epoxy resin solid content.

In addition, among brominated epoxy resins as above, preferred, in regard of providing higher glass transition temperature of the cured product with retaining fire retardancy, are ones having a bromine content of between 5% and 20% by weight per the solid content of the whole resin (without silica filler), and containing a novolac type epoxy resin in an amount of at least 40% and up to 100% by weight based on the whole amount of the epoxy resin solid content.

Moreover, ones comprising an epoxy resin free from any a bromine are halogen-free and preferred for low environmental load.

Phenol novolac resins, usable as the curing agent in this invention, are not particularly limited, but include, for example, phenol novolac resins, obtainable by reacting formaldehyde with phenols, such as phenol and cresol; and bisphenol novolac resins, obtainable by reacting formaldehyde with bisphenols, such as bisphenol A. These resins can be used singly or in combination of two or more.

Further, in case of mixing a phenol novolac resin curing agent as one component of the epoxy resin composition according to the present invention, it is preferred, for providing cured products having well balanced properties of glass transition temperature, peal strength and the like, to use an equivalent ratio of the epoxy group to the phenolic hydroxyl group in the range of 1:1.2 to 1:0.7.

As an organic solvent according to the invention, ketones, such as methyl ethyl ketone and cyclohexanone; and cellosolves, such as methoxypropanol can be preferably used.

Curing accelerators according to the invention are not particularly limited, but include, for example, imidazoles, such as 2-methylimidazole, 2-ethyl-4-methylimidazole, 2-phenylimidazole and 1-cyanoethyl-2-ethylimidazole; tertiary amines, such as benzyldimethylamine; organic phosphines, such as tributylphosphine and triphenylphosphine, and imidazolesilanes. These compounds can be used singly or in combination of two or more.

A silica filler used in the invention has a shape possessing at least two planes, an average particle diameter at least 0.3 μm and up to 10 μm, and a specific surface area at least 8 $m^2/g$ and at most 30 $m^2/g$, preferably at least 10 $m^2/g$ and at most 20 $m^2/g$.

The shape (geometry) of the above silica filler has at least two planes, and it is not spherical in shape. For example, there may be mentioned an indefinite shape obtainable by crushing.

Silica filler, possessing the same particle diameter as the above but have a specific surface area of 8 $m^2/g$ or less, has little effects of increasing an apparent resin viscosity and has no effect of preventing resin sagging during drying. In addition, a silica possessing a specific surface area exceeding 30 $m^2/g$ is not commercially available as an industrial product so that it cannot be used.

It is preferred to added the above silica filler in an amount of at least 3% and at most 80% by weight per the whole resin solid content.

In case of adding the above silica filler in an amount below 3% by weight, no advantage may be realized by its addition in some cases. In case of added amount exceeding 80% by weight, problems, in peal strength and easiness in drilling process, might possibly be generated.

In addition, it is preferred that above silica filler has an electric conductivity of 15 μs/cm (microsiemens/cm) or less in order to retain reliability with electric insulation.

Further, among silica fillers as mentioned above, preferred are ones obtained by melting at 1800° C. or higher to a vitrified form, because it provides cured products of lower coefficient of thermal expansion. Furthermore, this vitrified product is preferred since it is capable of eliminating crystalline substances, which are hazardous substance.

In addition, the silica filler mentioned above is preferably surface-treated with a silane coupling agent or the like to improve the interfacial strength between the resin and the silica filler.

A prepreg for a printed wiring board according to the present invention can be manufactured, for instance, by preparing a varnish of an epoxy resin composition for printed wiring board as above with an organic solvent as mentioned previously, impregnating the varnish into a glass cloth, and drying it in an oven at 120° C. to 180° C. for a curing period of the prepreg being between 60 and 180 seconds to make it into a semi-cured state (B-stage).

A laminated board for a printed wiring board according to the present invention can be manufactured, for example, by stacking a prescribed number of prepreg sheets as mentioned above and hot-pressing them at 140° C. to 200° C. and at 0.98 MPa to 4.9 MPa (mega Pascal) by laminate molding.

In this process, a metal foil is placed on one or both sides of a prescribed number of the prepreg sheets stacked for printed wiring board and laminate-molded to yield a metal foil-clad laminated board, which is fabricated into a printed wiring board. As the metal foil in this product, there may be used a copper foil, a silver foil, an aluminum foil, a stainless steel foil or the like.

In addition, a circuit is formed (formation of pattern) on an outer layer of the laminated board for printed wiring board manufactured as above to yield a printed wiring board according to the present invention. Specifically, for example, formation of the circuit can be achieved by application of a subtractive method to the metal foil on the outer layer of the metal clad laminated board to complete the printed wiring board.

Furthermore, a laminated printed wiring board can be produced through laminate-molding, using at least any one of a prepreg for printed wiring board, a laminated board for printed wiring board and a printed wiring board. Specifically, for example, a printed wiring board, which is completed with a circuit formation as above is used as a substrate board for an inner layer and a desired number of the prepreg sheets for printed wiring board are placed on one or both sides of this substrate board for the inner layer, as well as a metal foil is placed on the outside such that the metal foil side of the metal foil faces outwards, followed by hot-pressing them by laminate molding to yield a multilayered laminated board. In this process, the molding temperature is preferably set at a range between 150° C. and 180° C.

In addition, after the metal foil is coated by a bar coater with the epoxy resin composition in the form of varnish, the composition is dried at 160° C. for approximately 10 minutes to yield a resin-coated metal foil.

EXAMPLE

The present invention is specifically described using following examples.

At first, epoxy resins, curing agents, silica fillers, curing accelerator, additive, and organic solvents used are given in this order.

The epoxy resins used are as follows:

Epoxy 1: Dainippon Ink and Chemical Industries, Ltd., Epiclon 153-60M, epoxy equivalent=400 g/eq and bromine content=47% (brominated epoxy resin)

Epoxy 2: Shell Chemicals Co., EPON1124-A-80, epoxy equivalent=435 g/eq and bromine content=19.5% (epoxy resin obtained by reacting a bifunctional phenol derivative with a bisphenol A type epoxy resin.)

Epoxy 3: Dainippon Ink and Chemical Industries, Ltd., Epiclon 1120-80M, epoxy equivalent=485 g/eq and bromine content=20% (epoxy resin obtained by reacting a dihydric phenol with a bishphenol A type epoxy resin.)

Epoxy 4: Nippon Kayaku Co., BREN-S, epoxy equivalent=285 g/eq and bromine content=35.5% (brominated epoxy resin.)

Epoxy 5: Toto Kasei Co., YDCN-703, epoxy equivalent=210 g/eq (novolac type epoxy resin)

Epoxy 6: Dainippon Ink and Chemical Industries, Ltd., HP-7200H, epoxy equivalent=280 g/eq (dicyclopentadiene type epoxy resin)

Epoxy 7: Dainippon Ink and Chemical Industries, Ltd., Epiclon 850, epoxy equivalent=190 g/eq (bisphenol A type epoxy resin)

Epoxy 8: Dainippon Ink and Chemical Industries, Ltd., Epiclon N660, epoxy equivalent=210 g/eq (cresol novolac type epoxy resin)

Curing agents used are as follows:

Curing agent 1: Japan Epoxy Resin Co., YLH129B70, bishpenol A type novolac, equivalent of hydroxyl group=118 g/eq Curing agent 2: Dainippon Ink and Chemical Industries, Ltd., TD-2093, phenol novolac, equivalent of hydroxyl group=105 g/eq Curing agent 3: Dainippon Ink and Chemical Industries, Ltd., VH-4170, bisphenol A type novolac, equivalent of hydroxyl group=118 g/eq Curing agent 4: Dainippon Ink and Chemical Industries, Ltd, TD-2090, phenol novolac, equivalent of hydroxyl group=105 g/eq Curing agent 5: Gun Ei Chemical Industry Co., RESITOP PSM-4324, phenol novolac, equivalent of hydroxyl group=105 g/eq Curing agent 6: Dainippon Ink and Chemical Industries, Ltd., LA-7052, denatured phenol novolac, equivalent of hydroxyl group=120 g/eq.

Silica fillers used are as follows:

Silica filler 1: Denki Kagaku Kogyo Co., FS-2DC, treated with heat, average particle diameter=2.0 μm, specific surface area=11.4 m$^2$/g, geometry crushed, and electric conductivity=5.1 μs/cm.

Silica filler 2: Tatsumori Co., Krystallite 5X, not treated with heat, average particle diameter=1.5 μm, specific surface area=16.5 m$^2$/g, geometry crushed, and electric conductivity=2 μs/cm Silica filler 3: Tatsumori Co., Fuserex AS-1, treated with heat, average particle diameter=3.0 μm, relative surface area=16.2 m$^2$/g, geometry crushed, and electric conductivity=1 μs/cm Silica filler 4: Tatsumori Co., Krystallite WX, treated with heat, average particle diameter=1.2 μm, specific surface area=15.3 m$^2$/g, geometry crushed, and electric conductivity=7 μs/cm Silica filler 5: Denki Kagaku Kogyou Co., FS-30, treated with heat, average particle diameter=6.1 μm, specific surface area=4.5 m$^2$/g, geometry crushed, and electric conductivity=2.8 μs/cm Silica filler 6: ADAMATECHS Co., SO-C2, treated with heat, average particle diameter=0.5 μm, relative surface area=8 m$^2$/g, geometry spherical and electric conductivity=7.8 μs/cm In addition, the specific surface area is measured with a BET method; whereas the average particle diameter is determined by a laser diffraction method to be referred to a d50 value. The electric conductivity is also determined with a conductivity cell measuring the electric conductivity of an extracted water of 10 g of the sample added to 100 ml of purified water and then pulsated for 30 minutes.

Curing accelerator used is as follows:

Accelerator 1: Shikoku Chemicals Corp., 2-ethyl-4-methylimidazole.

Additive used is as follows:

Additive 1: Daihachi Chemical Industry Co., PX-200 (fire retardant)

Organic solvents used are as follows:

Organic solvent 1: methyl ethyl ketone

Organic solvent 2: methoxypropanol

Examples 1 to 10 and Comparative Examples 1 to 3

The materials given in Table 1 were formulated in a desired amount (unit, pbw) and stirred for approximately 90 minutes, and then a silica filler was uniformly dispersed in a varnish with a NanoMill grinding mill to yield an epoxy resin composition (varnish) for printed wiring board in Examples 1 to 10 and in Comparative Examples 1 to 3.

In addition, a bromine content in the epoxy resin composition was calculated by the following method:

A sum of the bromine content in each epoxy resin multiplied with the amount of the solid content formulated is divided by a sum of the solid content formulated with both each epoxy resin and a curing agent, then multiplied by 100.

(Manufacturing Method of Prepreg for Printed Wiring Board)

A glass cloth 0.2 mm thick (Nitto Boseki Co., "WEA7628") was impregnated with the varnish of the resin composition for printed wiring board obtained in Examples 1 to 10 and in Comparative Examples 1 to 3 and dried in a drying oven (120° C. to 180° C.) for a curing period between 60 seconds and 180 seconds to adjust the amount of the resin impregnated being either 40% or 50% by weight, yielding a prepreg for printed wiring board in a half-cured state (B-stage).

Manufacturing Method of Laminated Board for Printed Wiring Board

Four or five sheets of the products of prepreg for printed wiring board containing 40% by weight impregnated resin, obtained as mentioned above, were chosen, on both sides of which a copper foil was placed, followed by hot-pressing them at 140° C. to 180° C. under 0.98 MPa to 3.9 MPa with a pressing machine by laminate molding to yield a copper-clad laminated board with board thickness of either 0.8 mm or 1.0 mm. The heating period during the laminate molding was set such that the temperature of the prepreg for printed wiring board as a whole reached 160° C. or higher for at least 60 minutes or longer. Furthermore, as the copper foil, a "GT" foil from Furukawa Circuit Foil Co. (thickness, 18 μm) was used.

Physical properties listed below of the prepreg for printed wiring board and the laminated board for printed wiring board thus obtained were evaluated. The results are shown in Table 2.

Appearance of Prepreg

Appearance of the products of prepreg for printed wiring board containing 50% by weight impregnated resin, obtained by the manufacturing method as above was visually inspected.

Glass Transition Temperature

After a copper foil of the laminated board for printed wiring board obtained in the above was removed by etching, the specimen was used to measure the glass transition temperature by a differential scanning calorimetric method according to IPC-TM-650 section 2.4.25.

Fire Retardancy

After a surface copper foil of the copper clad laminated board with a board thickness of 0.8 mm was removed by etching, the specimen was cut into 125 mm long and 13 mm wide and burned by a UL vertical burning test method (UL94).

Measurement of Curing Time

The prepreg prepared as above was rubbed to loosen to a powder, which was filtered through a 60 mesh filter in order to remove foreign materials such as glass fiber, and then its curing period of time was measured according to JIS-C6521, section 5.7.

Measurement of Percent of Water Absorption

After the surface copper foil of the copper clad laminated board with board thickness of 1.0 mm was removed by etching, the board was cut into a 50 mm square and conditioned under a pre-conditioning time (PCT) of 3 hours and 3 atmospheric pressure to determine the percent of water adsorption, which was then calculated by the equation below:

Percent of water absorption=((weight after processing−initial weight)/initial weight)×100 (%)

Peal Strength of Copper Foil

Peal strength of the copper foil was measured with use of the copper-clad laminated board with board thickness of 1.0 mm according to JIS-C6481.

Results of Evaluation

It is clearly illustrated in Table 2 that the appearance of the prepreg in Examples 1 to 10, in which a silica filler contained has at least two or more planes in the geometry, an average particle diameter between 0.3 μm and 10 μm, and a specific surface area between 8 m$^2$/g and 30 m$^2$/g (preferably between 10 m$^2$/g and 20 m$^2$/g), is better than that in Comparative Example 1 containing no silica filler and in Comparative Examples 2 and 3 containing silica filler outside the scope specified above.

TABLE 1

| Composition | | Example 1 | Example 2 | Example 3 | Example 4 | Example 5 |
|---|---|---|---|---|---|---|
| Epoxy resin | Epoxy 1 | | 41.7 | 16.7 | 66.7 | |
| | Epoxy 2 | | | 112.5 | | 112.5 |
| | Epoxy 3 | 112.5 | | | | |
| | Epoxy 4 | | 25.0 | | | |
| | Epoxy 5 | 10.0 | | | 60.0 | 10.0 |
| | Epoxy 6 | | 50.0 | | | |
| | Epoxy 7 | | | | | |
| | Epoxy 8 | | | | | |
| Curing agent | Curing agent 1 | | | 41.1 | | |
| | Curing agent 2 | | | | 40.5 | |
| | Curing agent 3 | 27.6 | | | | |
| | Curing agent 4 | | 34.6 | | | |
| | Curing agent 5 | | | | | 26.7 |
| | Curing agent 6 | | | | | |
| Additive | Additive 1 | | | | | |
| Curing accelerator | Accelerator 1 | 0.128 | 0.067 | 0.128 | 0.070 | 0.060 |
| Silica filler | Silica filler 1 | | | | 70.3 | |
| | Silica filler 2 | 25.5 | | | | |
| | Silica filler 3 | | 26.9 | | | 31.7 |

TABLE 1-continued

| | | | | | | |
|---|---|---|---|---|---|---|
| | Silica filler 4 | | | 19.3 | | |
| | Silica filler 5 | | | | | |
| | Silica filler 6 | | | | | |
| Organic solvent | Organic solvent 1 | 17.0 | 18.0 | — | 25.0 | 22.7 |
| | Organic solvent 2 | 26.0 | 38.2 | 28.0 | 25.0 | 22.7 |
| Bromine content (%) (per whole amount of resin solid content | | 14.1% | 15.5% | 17.4% | 13.7% | 13.9% |

| Composition | | Example 6 | Example 7 | Example 8 | Example 9 | Example 10 |
|---|---|---|---|---|---|---|
| Epoxy resin | Epoxy 1 | 41.7 | | | 41.7 | 66.7 |
| | Epoxy 2 | | | | | |
| | Epoxy 3 | | | | | |
| | Epoxy 4 | 25.0 | | | 25.0 | |
| | Epoxy 5 | | | | | 60.0 |
| | Epoxy 6 | 50.0 | | | 50.0 | |
| | Epoxy 7 | | 100.0 | | | |
| | Epoxy 8 | | | 100.0 | | |
| Curing agent | Curing agent 1 | | | | | |
| | Curing agent 2 | | | | 38.8 | |
| | Curing agent 3 | | | | | |
| | Curing agent 4 | 34.6 | 55.3 | | | 40.5 |
| | Curing agent 5 | | | | | |
| | Curing agent 6 | | | 95.2 | | |
| Additive | Additive 1 | | 40.0 | | | |
| Curing accelerator | Accelerator 1 | 0.067 | 0.150 | 0.120 | 0.070 | 0.056 |
| Silica filler | Silica filler 1 | | 46.6 | | | |
| | Silica filler 2 | | | 15.7 | 111.0 | |
| | Silica filler 3 | | | | | |
| | Silica filler 4 | 13.5 | | | | 182.6 |
| | Silica filler 5 | | | | | |
| | Silica filler 6 | | | | | |
| Organic solvent | Organic solvent 1 | 18.0 | 75.0 | 43.0 | 45.0 | 50.0 |
| | Organic solvent 2 | 38.2 | 25.0 | — | 45.0 | 60.0 |
| Bromine content (%) (per whole amount of solid content | | 15.5% | 0.0% | 0.0% | 15.0% | 13.7% |

| Composition | | Comparative example 1 | Comparative example 2 | Comparative example 3 |
|---|---|---|---|---|
| Epoxy resin | Epoxy 1 | | | |
| | Epoxy 2 | | | |
| | Epoxy 3 | 112.5 | 112.5 | 112.5 |
| | Epoxy 4 | | | |
| | Epoxy 5 | 10.0 | 10.0 | 10.0 |
| | Epoxy 6 | | | |
| | Epoxy 7 | | | |
| | Epoxy 8 | | | |
| Curing agent | Curing agent 1 | | | |
| | Curing agent 2 | | | |
| | Curing agent 3 | 27.6 | 27.6 | 27.6 |
| | Curing agent 4 | | | |
| | Curing agent 5 | | | |
| | Curing agent 6 | | | |
| Additive | Additive 1 | | | |
| Curing accelerator | Accelerator 1 | 0.128 | 0.067 | 0.128 |
| Silica filler | Silica filler 1 | | | |
| | Silica filler 2 | | | |

TABLE 1-continued

|  |  |  |  |  |
|---|---|---|---|---|
|  | Silica filler 3 |  |  |  |
|  | Silica filler 4 |  |  |  |
|  | Silica filler 5 |  | 25.5 |  |
|  | Silica filler 6 |  |  | 25.5 |
| Organic solvent | Organic solvent 1 | 18.5 | 17.0 | 17.0 |
|  | Organic solvent 2 | 18.5 | 26.0 | 26.0 |
| Bromine content (%) (per whole amount of resin solid content |  | 14.1% | 14.1% | 14.1% |

Note

|  | Name of manufacture | Trade name | Epoxy equivalent | Bromine content | Remarks |
|---|---|---|---|---|---|
| Epoxy 1 | Dainippon Ink and Chemical Industries, Ltd | Epiclon 153-60M | 400 g/eq | 48.0% | Brominated epoxy resin |
| Epoxy 2 | Shell Chemical Co. | EPON 1124-A-80 | 435 g/eq | 19.5% | Epoxy resin obtained by reacting a dihydric phenol with bisphenol A type epoxy resin |
| Epoxy 3 | Dainippon Ink and Chemical Industries, Ltd | Epiclon 1120-80M | 485 g/eq | 20.0% | Epoxy resin obtained by reacting a dihydric phenol with bisphenol A type epoxy resin |
| Epoxy 4 | Nippon Kayaku Co. | BREN-S | 285 g/eq | 35.5% | Brominated epoxy resin |
| Epoxy 5 | Toto Kasei Co. | YDCN-703 | 210 g/eq | — | Novolac type epoxy resin |
| Epoxy 6 | Dainippon Ink and Chemical Industries, Ltd | HP-7200H | 280 g/eq | — | Dicyclopentadiene type epoxy resin |
| Epoxy 7 | Dainippon Ink and Chemical Industries, Ltd | Epiclon 850 | 190 g/eq | — | Bisphenol A type epoxy resin |
| Epoxy 8 | Dainippon Ink and Chemical Industries, Ltd | Epiclon N660 | 210 g/eq | — | Cresol novolac type epoxy resin |

|  | Name of manufacture | Trade name | Equivalent of hydroxyl group | Remark |
|---|---|---|---|---|
| Curing agent 1 | Japan Epoxy Resin Co. | YLH129B70 | 118 g/eq | Bisphenol A type novolac |
| Curing agent 2 | Dainippon Ink and Chemical Industries, Ltd. | TD-2093 | 105 g/eq | Phenol novolac |
| Curing agent 3 | Dainippon Ink and Chemical Industries, Ltd. | VH-4170 | 118 g/eq | Bisphenol A novolac |
| Curing agent 4 | Dainippon Ink and Chemical Industries, Ltd. | TD-2090 | 105 g/eq | Phenol novolac |
| Curing agent 5 | Gun Ei Chemical Industry Co. | Resitop PSM-4324 | 105 g/eq | Phenol novolac |
| Curing agent 6 | Dainippon Ink and Chemical Industries, Ltd. | LA-7052 | 120 g/eq | Modified phenol novolac |

|  | Name of manufacture | Trade name |
|---|---|---|
| Additive 1 | Daihachi Chemical Industry Co. | PX-200 (fire retardant) |
| Accelerator 1 | Shikoku Chemical Co. | 2-Ethyl-4-methyl-imidazole |

|  | Name of manufacture | Trade name | Heat treatment | Average particle diameter | Specific surface area | Geometry | Electric conductivity |
|---|---|---|---|---|---|---|---|
| Silica filler 1 | Denki Kagaku Kogyo Co. | FS-2DC | yes | 2.0 μm | 11.4 m$^2$/g | Crushed | 5.1 μs/cm |
| Silica filler 2 | Tatsumori Co. | Krystalite 5X | no | 1.5 μm | 16.5 m$^2$/g | Crushed | 2.0 μs/cm |

TABLE 1-continued

| Silica filler 3 | Tatsumori Co | Fuserex AS-1 | yes | 3.0 μm | 16.2 m²/g | Crushed | 1.0 μs/cm |
| Silica filler 4 | Tatsumori Co | Fusesrex WX | yes | 1.2 μm | 15.3 m²/g | Crushed | 7.0 μs/cm |
| Silica filler 5 | Denki Kagaku Kogyo Co. | FS-30 | yes | 6.1 μm | 4.5 m²/g | Crushed | 2.8 μs/cm |
| Silica filler 6 | ADNATECHS Co. | SO-C2 | yes | 0.5 μm | 8.0 m²/g | spherical | 7.8 μs/cm |

Organic solvent 1 Methyl ethyl ketone
Organic solvent 2 Methoxypropanol

TABLE 2

|  |  | Example 1 | Example 2 | Example 3 | Example 4 | Example 5 |
|---|---|---|---|---|---|---|
| Silica filler | Amount added | 20 parts | 20 parts | 15 parts | 50 parts | 25 parts |
|  | Average particle diameter (μm) | 1.5 | 3.0 | 1.2 | 2.0 | 3.0 |
|  | Specific surface area (m²/g) | 16.5 | 16.2 | 15.3 | 11.4 | 16.2 |
|  | Geometry | crushed | crushed | crushed | crushed | crushed |
|  | Heat treatment | no | yes | yes | yes | yes |
|  | Electric conductivity (μs/cm) | 2.0 | 1.0 | 7.0 | 5.1 | 1.0 |
| Evaluation results | Appearance of prepreg | good | good | good | good | good |
|  | Fire retardancy | V-0 | V-0 | V-0 | V-0 | V-0 |
|  | Tg (DSC) | 137° C. | 165° C. | 135° C. | 175° C. | 140° C. |
|  | Percent of water absorption (%) | 0.47 | 0.31 | 0.51 | 0.30 | 0.45 |
|  | Peal strength of copper foil (KN/m²) | 1.2 | 1.1 | 1.2 | 1.1 | 1.2 |

|  |  | Example 6 | Example 7 | Example 8 | Example 9 | Example 10 |
|---|---|---|---|---|---|---|
| Silica filler | Amount added | 10 parts | 30 parts | 10 parts | 80 parts | 130 parts |
|  | Average particle diameter (μm) | 1.2 | 2.0 | 3.0 | 1.5 | 1.2 |
|  | Specific surface area (m²/g) | 15.3 | 11.4 | 16.2 | 16.5 | 15.3 |
|  | Geometry | crushed | crushed | crushed | crushed | crushed |
|  | Heat treatment | yes | yes | yes | no | yes |
|  | Electric conductivity (μs/cm) | 7.0 | 5.1 | 1.0 | 2.0 | 7.0 |
| Evaluation results | Appearance of prepreg | good | good | good | good | good |
|  | Fire retardancy | V-0 | V-0 | V-0 | V-0 | V-0 |
|  | Tg (DSC) | 165° C. | 113° C. | 160° C. | 165° C. | 175° C. |
|  | Percent of water absorption (%) | 0.36 | 0.61 | 0.40 | 0.25 | 0.20 |
|  | Peal strength of copper foil (KN/m²) | 1.1 | 1.1 | 1.1 | 1.1 | 0.8 |

|  |  | Comparative Example 1 | Comparative Example 2 | Comparative Example 3 |
|---|---|---|---|---|
| Silica filler | Amount added | none | 20 parts | 20 parts |
|  | Average particle diameter (μm) | — | 6.1 | 0.5 |
|  | Specific surface area (m²/g) | — | 4.5 | 8.0 |
|  | Geometry | — | crushed | Spherical |
|  | Heat treatment | — | yes | yes |
|  | Electric conductivity (μs/cm) | — | 2.8 | 7.8 |
| Evaluation results | Appearance of prepreg | Sagging of resin | Sagging of resin | Sagging of resin |
|  | Fire retardancy | V-0 | V-0 | V-0 |
|  | Tg (DSC) | 137° C. | 137° C. | 137° C. |

TABLE 2-continued

| | | | |
|---|---|---|---|
| Percent of water absorption (%) | 0.60 | 0.47 | 0.47 |
| Peal strength of copper foil (KN/m$^2$) | 1.2 | 1.2 | 1.2 |

INDUSTRIAL APPLICABILITY

The epoxy resin composition for printed wiring board according to the present invention, which uses, in a resin composition comprised of an epoxy resin, a phenol novolac resin and a curing accelerator, a silica filler having a geometry possessing at least two planes, an average particle diameter between 0.3 μm and 10 μm and a specific surface area between 8 m$^2$/g and 30 m$^2$/g, is capable of increasing apparent resin viscosity to prevent resin sagging in a drying oven and capable of penetrating into a reinforcing material without being impaired because viscosity of the resin itself is locally minimally increased, leading to improvement of the appearance of the prepreg.

In the epoxy resin composition for printed wiring board according to the invention, through addition of a silica filler possessing at least two planes, an average particle diameter between 0.3 μm and 10 μm, and a specific surface area between 10 m$^2$/g and 20 m$^2$/g to the resin in an amount between 3% and 80% by weight per the solid content of the resin, there can be attained effects of increasing apparent resin viscosity to prevent resin sagging in a drying oven and of improving appearance of the prepreg without impairing penetration of the resin into the reinforcing material, because viscosity of the resin itself is not locally increased.

The epoxy resin composition for printed wiring board according to this invention gives excellent reliability in a long term electric insulation, by using, as the silica filler, ones having an electric conductivity of 15 μs/cm or less.

The epoxy resin composition for printed wiring board according to the invention is capable of eliminating crystalline substances as hazardous materials, by using, as the silica filler, vitrified ones through melting the silica at a temperature of 1800° C. or higher.

The invention claimed is:

1. A process for producing a printed wiring board, which comprises: gluing a prepreg to a metal foil surface and hot pressing the prepreg and the metal foil surface to produce a laminate board, and forming a circuit on an outer layer of the laminate board to yield a printed wiring board; wherein said prepreg is manufactured by impregnating a reinforcing material with an epoxy resin composition followed by drying and semi-curing the composition to B-stage; said epoxy resin composition comprising an epoxy resin, a phenol novolac resin, a curing accelerator and a silica filler; wherein said silica filler is a silica filler which has a shape having at least two planes, and has an average particle diameter between 0.3 pin and 10 μm and a relative surface area between 8 m$^2$/g and 30 m$^2$/g.

2. A process for producing a printed wiring board as described in claim 1, wherein said silica filler is a silica filler having at least two planes in the shape, an average particle diameter between 0.3 μm and 10 μm and a relative surface area between 10 m$^2$/g and 20 m$^2$/g.

3. A process for producing a printed wiring board as described in claim 1, wherein said silica filler is added in an amount of from 3% to 80% by weight per the solid content of the resin.

4. A process for producing a printed wiring board as described in claim 1, wherein said silica filler is a silica filler having an electric conductivity of 15 μs or less.

5. A process for producing a printed wiring board as described in claim 1, wherein said silica filler is a silica filler which has been vitrified through melting at a temperature of 1800° C or higher.

6. A process for producing a printed wiring board as described in claim 1, wherein said epoxy resin is an epoxy resin having a bromine content of between 5% and 20% by weight per the solid content of the resin without silica filler and containing an epoxy resin obtained by reacting a dihydric phenol with a bisphenol A type epoxy resin in an amount of between 40% and 100% by weight based on the whole amount of the epoxy resin solid content.

7. A process for producing a printed wiring board as described in claim 1, wherein said epoxy resin is an epoxy resin having a bromine content of between 5% and 20% by weight per the solid content of the resin without silica filler and containing an epoxy resin possessing a dicyclopentadienyl structure in an amount of between 40% and 100% by weight based on the whole amount of the epoxy resin solid content.

8. A process for producing a printed wiring board as described in claim 1, wherein said epoxy resin is an epoxy resin having a bromine content of between 5% and 20% by weight per the solid content of the resin without silica filler and containing of a novolac type epoxy resin in an amount of between 40% and 100% by weight based on the whole amount of the epoxy resin solid content.

9. A process for producing a printed wiring board as described in claim 1, wherein said epoxy resin composition is a bromine-free epoxy resin composition.

10. A process for producing a printed wiring board, which comprises:
coupling a prepreg to a metal foil surface to produce a laminate board, and forming a circuit on an outer layer of the laminate board to yield a printed wiring board; wherein said prepreg is obtained by impregnating a reinforcing material with an epoxy resin composition for a printed wiring board and drying said composition to B-stage; said epoxy resin composition comprising an epoxy resin, a phenol novolac resin, a curing accelerator, and a silica filler which has a shape having at least two planes and has an average particle diameter between 0.3 μm and 10 μm and a relative surface area between 8 m$^2$/g and 30 m$^2$/g.

11. A printed wiring board, which is formed from a laminated board;
wherein said laminate board is obtained by coupling a prepreg to a metal foil surface to produce a laminate board, and forming a circuit on an outer layer of the laminate board to yield a printed wiring board; wherein said prepreg is obtained by impregnating a reinforcing material with an epoxy resin composition for a printed wiring board and drying said composition to B-stage; said epoxy resin composition comprising an epoxy resin, a phenol novolac resin, a curing accelerator, and a silica filler which has a shape having at least two planes and has an average particle diameter between 0.3 μm and 10 μm and a relative surface area between 8 $m^2/g$ and 30 $m^2/g$.

* * * * *

UNITED STATES PATENT AND TRADEMARK OFFICE
CERTIFICATE OF CORRECTION

PATENT NO. : 7,566,501 B2
APPLICATION NO. : 10/565407
DATED : July 28, 2009
INVENTOR(S) : Motobe et al.

Page 1 of 1

It is certified that error appears in the above-identified patent and that said Letters Patent is hereby corrected as shown below:

In the Claims:

Claim 1, col. 15, line 60, please delete "0.3 pin" and substitute therefor -- 0.3 µm --.

Signed and Sealed this

Sixth Day of October, 2009

David J. Kappos
*Director of the United States Patent and Trademark Office*